(12) United States Patent
Kataoka et al.

(10) Patent No.: US 11,043,721 B2
(45) Date of Patent: Jun. 22, 2021

(54) CONNECTION STRUCTURE OF CONDUCTOR AND CONDUCTIVE MODULE

(71) Applicant: Yazaki Corporation, Tokyo (JP)

(72) Inventors: Ryota Kataoka, Shizuoka (JP);
Hirotaka Mukasa, Shizuoka (JP);
Shinichi Yanagihara, Shizuoka (JP)

(73) Assignee: YAZAKI CORPORATION, Tokyo (JP)

( * ) Notice: Subject to any disclaimer, the term of this patent is extended or adjusted under 35 U.S.C. 154(b) by 158 days.

(21) Appl. No.: 15/793,926

(22) Filed: Oct. 25, 2017

(65) Prior Publication Data
US 2018/0166673 A1    Jun. 14, 2018

(30) Foreign Application Priority Data

Dec. 9, 2016 (JP) .............................. JP2016-239796

(51) Int. Cl.
*H01M 50/00* (2021.01)
*H01M 50/54* (2021.01)
*H01M 10/48* (2006.01)
*H01M 50/20* (2021.01)
*H01M 50/502* (2021.01)
(Continued)

(52) U.S. Cl.
CPC ....... *H01M 50/54* (2021.01); *H01M 10/0525* (2013.01); *H01M 10/4207* (2013.01); *H01M 10/482* (2013.01); *H01M 50/20* (2021.01); *H01M 50/502* (2021.01); *H01M 50/543* (2021.01); *H01M 2200/103* (2013.01); *H01M 2220/20* (2013.01); *H05K 1/0263* (2013.01)

(58) Field of Classification Search
CPC .............................................. H01M 2200/103
See application file for complete search history.

(56) References Cited

U.S. PATENT DOCUMENTS 6,111,387 A     8/2000   Kouzu et al.
6,168,470 B1    1/2001   Ikeda et al.
(Continued)

FOREIGN PATENT DOCUMENTS

CN    1595716 A      3/2005
JP    10-270006 A    10/1998
(Continued)

OTHER PUBLICATIONS

English translation of JP-2015207393-A (Year: 2015).*
Japanese Office Action for the related Japanese Patent Application No. 2016-239796 dated Feb. 26, 2019.

*Primary Examiner* — Milton I Cano
*Assistant Examiner* — Mary G Henshaw
(74) *Attorney, Agent, or Firm* — Kenealy Vaidya LLP

(57) ABSTRACT

A conductor includes a connection conductor that is directly connected to at least one of a plurality of electrode terminals of an electrode terminal group of a plurality of battery cells arranged in a same direction; a linear conductor that is connected to a battery monitoring unit configured to monitor a battery state of the battery cells; a fuse element that is indirectly connected between the connection conductor and the linear conductor, and that melts when overcurrent flows between the connection conductor and the linear conductor; and a resin mold member that has an insulation property and that includes the fuse element, a part of the connection conductor, and a part of a relay terminal.

7 Claims, 5 Drawing Sheets

(51) Int. Cl.
 *H01M 50/543* (2021.01)
 *H01M 10/0525* (2010.01)
 *H01M 10/42* (2006.01)
 *H05K 1/02* (2006.01)

(56) References Cited

U.S. PATENT DOCUMENTS

| | | | |
|---|---|---|---|
| 6,211,645 B1 | 4/2001 | Kouzu et al. | |
| 6,211,646 B1 | 4/2001 | Kouzu et al. | |
| 6,240,637 B1* | 6/2001 | Ikeda | H01M 2/206 29/854 |
| 10,210,996 B2 | 2/2019 | Kuboki et al. | |
| 2004/0166405 A1* | 8/2004 | Senda | H01H 37/761 429/127 |
| 2012/0019061 A1* | 1/2012 | Nishihara | H01M 2/1077 307/10.1 |
| 2012/0058368 A1* | 3/2012 | Yamamoto | H01M 2/105 429/7 |
| 2013/0280560 A1* | 10/2013 | Lim | H01M 2/34 429/49 |
| 2014/0322978 A1* | 10/2014 | Okamoto | H01M 2/206 439/620.26 |
| 2017/0040583 A1* | 2/2017 | Kuboki | H01M 2/10 |
| 2017/0207023 A1 | 7/2017 | Kuboki et al. | |
| 2018/0145300 A1* | 5/2018 | Okazaki | H01M 10/6554 |
| 2018/0164382 A1 | 6/2018 | Kataoka et al. | |
| 2018/0166840 A1 | 6/2018 | Okazaki | |

FOREIGN PATENT DOCUMENTS

| | | |
|---|---|---|
| JP | 11-120986 A | 4/1999 |
| JP | 2001-110396 A | 4/2001 |
| JP | 2015-207393 A | 11/2015 |
| JP | 2015207393 A * | 11/2015 |
| JP | 2018-097986 A | 6/2018 |
| JP | 2018-097988 A | 6/2018 |
| WO | 2016/017683 A1 | 2/2016 |

* cited by examiner

CONNECTION STRUCTURE OF CONDUCTOR AND CONDUCTIVE MODULE

CROSS-REFERENCE TO RELATED APPLICATION(S)

The present application claims priority to and incorporates by reference the entire contents of Japanese Patent Application No. 2016-239796 filed in Japan on Dec. 9, 2016.

BACKGROUND OF THE INVENTION

1. Field of the Invention

The present invention relates to a connection structure of a conductor and a conductive module.

2. Description of the Related Art

Conventionally, a battery module formed of a plurality of battery cells and a battery monitoring unit configured to monitor the battery state of the battery cells are mounted on a vehicle such as an electric vehicle (EV) and a hybrid electric vehicle (HEV). The battery cells and the battery monitoring unit are connected with each other with a conductive module interposed therebetween. Some of the conductive modules include a connection conductor such as a bus bar connected to an electrode terminal of the battery cell, a linear conductor such as an electric wire connected to the battery monitoring unit, a fuse interposed between the connection conductor and the linear conductor, and a case for housing the connection conductor, the linear conductor, and the fuse. For example, as illustrated in FIG. 4 in Japanese Patent Application Laid-open No. 2015-207393, a conductive module in which a fuse connection unit 42 provided on a bus bar 104 is connected to an electric wire 9b, via a relay terminal 7a, one of terminal units 81, a housing 80 having a fuse 8, the other terminal unit 81 in this order, has been disclosed.

In the conventional conductive module described above, the conductive module and the battery monitoring unit can be protected from overcurrent by the fuse interposed between the connection conductor and the linear conductor. However, when the fuse is interposed between the connection conductor and the linear conductor, components used to relay between the connection conductor and the linear conductor increase in number. Consequently, there is a room for improvement in terms of downsizing.

SUMMARY OF THE INVENTION

An object of the present invention is to provide a connection structure of a conductor and a conductive module that achieves downsizing.

A connection structure of a conductor according to one aspect of the present invention includes a connection conductor that is directly or indirectly connected to at least one of a plurality of electrode terminals of an electrode terminal group of a plurality of battery cells arranged in a same direction; a linear conductor that is connected to a battery monitoring unit configured to monitor a battery state of the battery cells; a fuse element that is directly or indirectly connected between the connection conductor and the linear conductor, and that melts when overcurrent flows between the connection conductor and the linear conductor; and a resin mold member that has an insulation property and that includes the fuse element and a part of the connection conductor.

According to another aspect of the present invention, in the connection structure of the conductor, it is preferable that the fuse element is connected to the linear conductor via a relay terminal made of metal, and the resin mold member further includes a part of the relay terminal.

According to still another aspect of the present invention, in the connection structure of the conductor, it is preferable that the fuse element includes a pair of terminals and a fusible part provided between the pair of terminals, and the connection conductor is connected to one of the pair of terminals, and the linear conductor or the relay terminal is connected to the other terminal.

A conductive module according to still another aspect of the present invention includes a plurality of conductors that correspond to at least one of electric terminals, each of the conductors including a connection conductor that is directly or indirectly connected to at least one of the electrode terminals of an electrode terminal group of a plurality of battery cells arranged in a same direction, a linear conductor that is connected to a battery monitoring unit configured to monitor a battery state of the battery cells, a fuse element that is directly or indirectly connected between the connection conductor and the linear conductor, and that melts when overcurrent flows between the connection conductor and the linear conductor, and a resin mold member that has an insulation property and that includes the fuse element and a part of the connection conductor, wherein the connection conductors are respectively housed in a plurality of housing space units that are included in a housing case having an insulation property and that are arranged in an arranging direction of the electrode terminals.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Hereinafter, embodiments of a connection structure of a conductor and a conductive module according to the present invention will be described in detail with reference to the accompanying drawings. It is to be noted that the present invention is not limited to the following embodiments. Moreover, components in the following embodiments include components that can be easily replaced by those skilled in the art or components that are substantially the same, and various omissions, substitutions, and changes may be made without departing from the spirit of the invention.

First Embodiment

Figure 1:
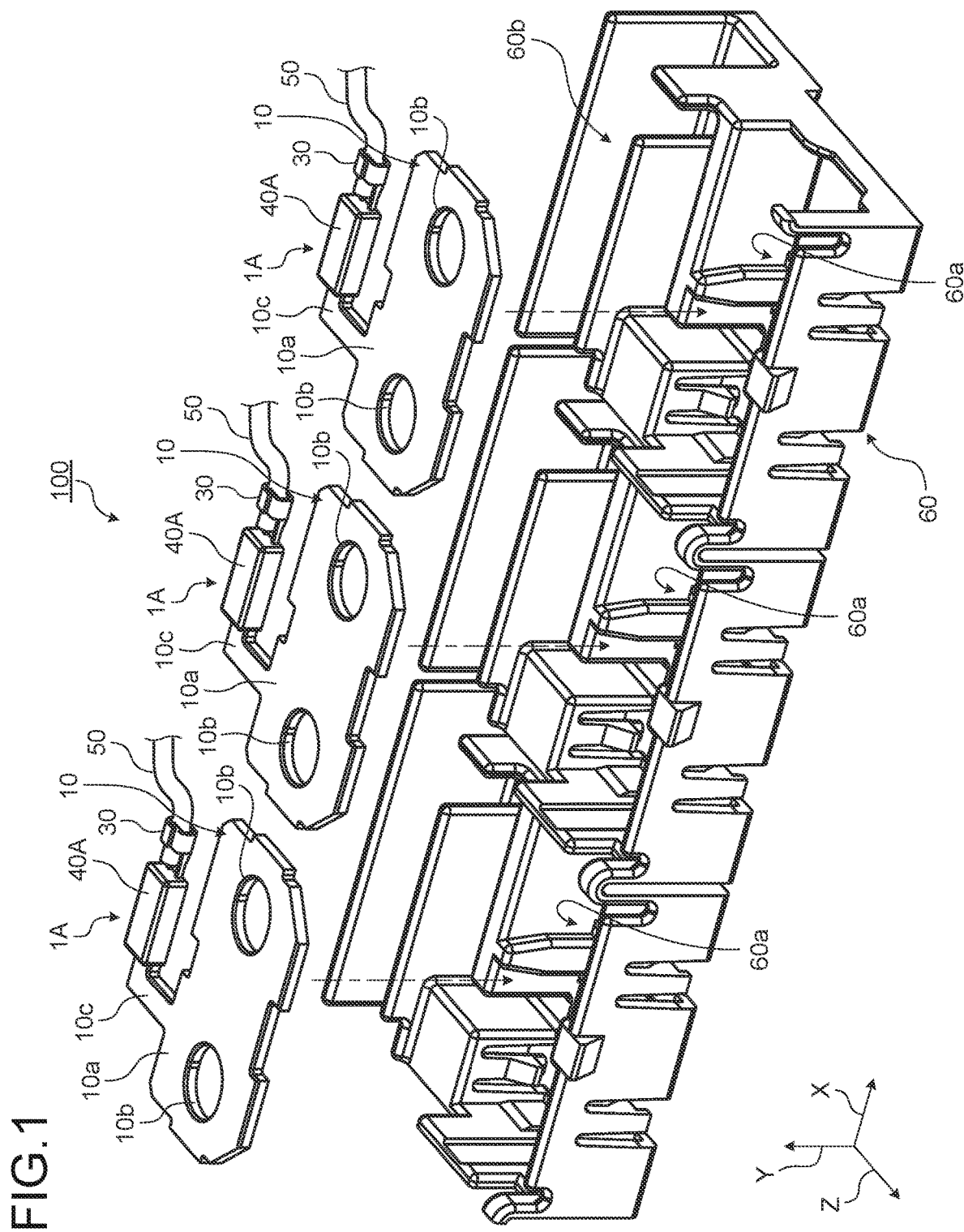
FIG. 1 is an exploded perspective view illustrating a schematic configuration of a conductive module to which a connection structure of a conductor according to a first embodiment is applied.
Figure 2:
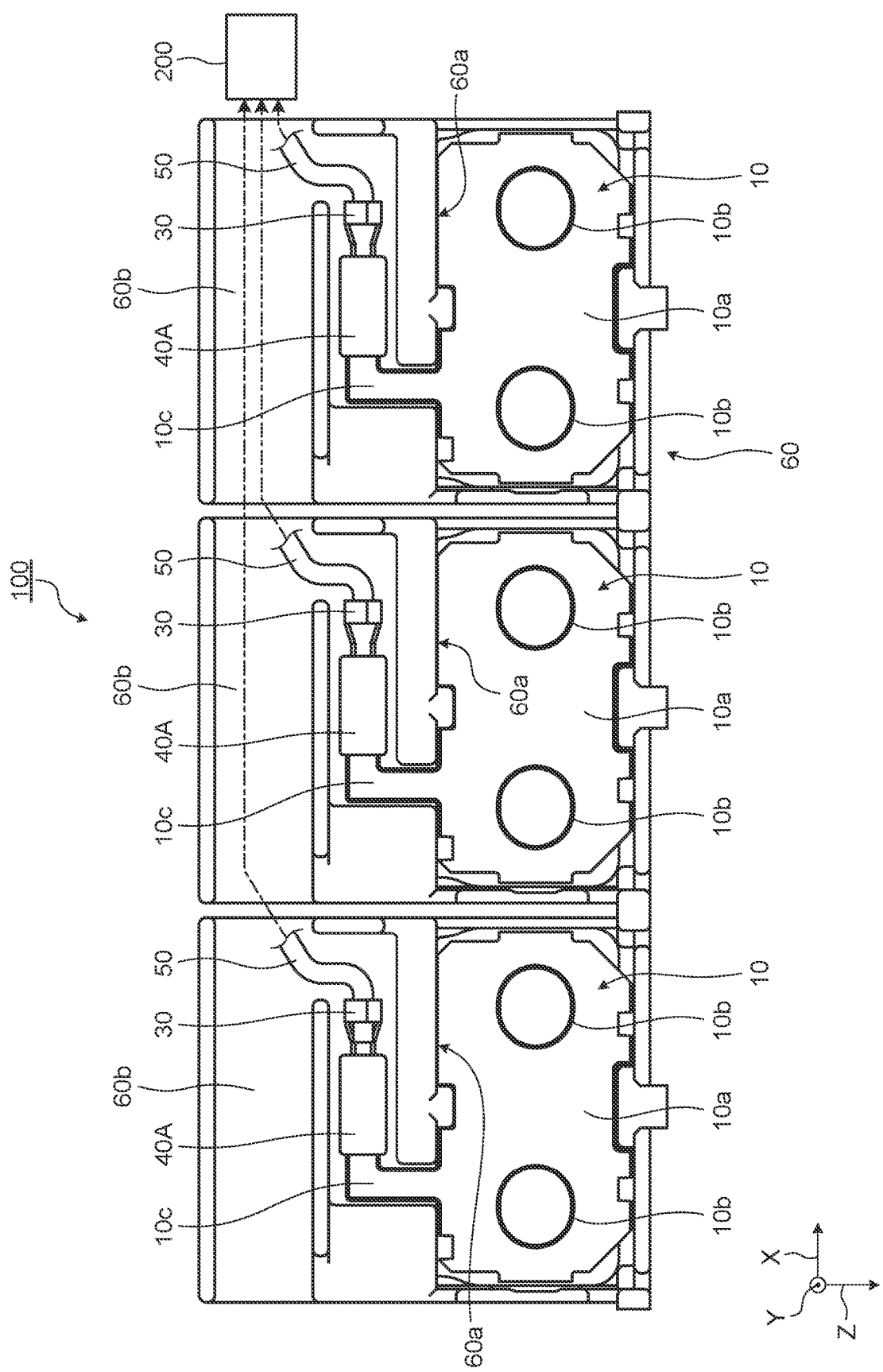
FIG. 2 is a plan view illustrating a schematic configuration of the conductive module to which the connection structure of the conductor according to the first embodiment is applied.
Figure 3:
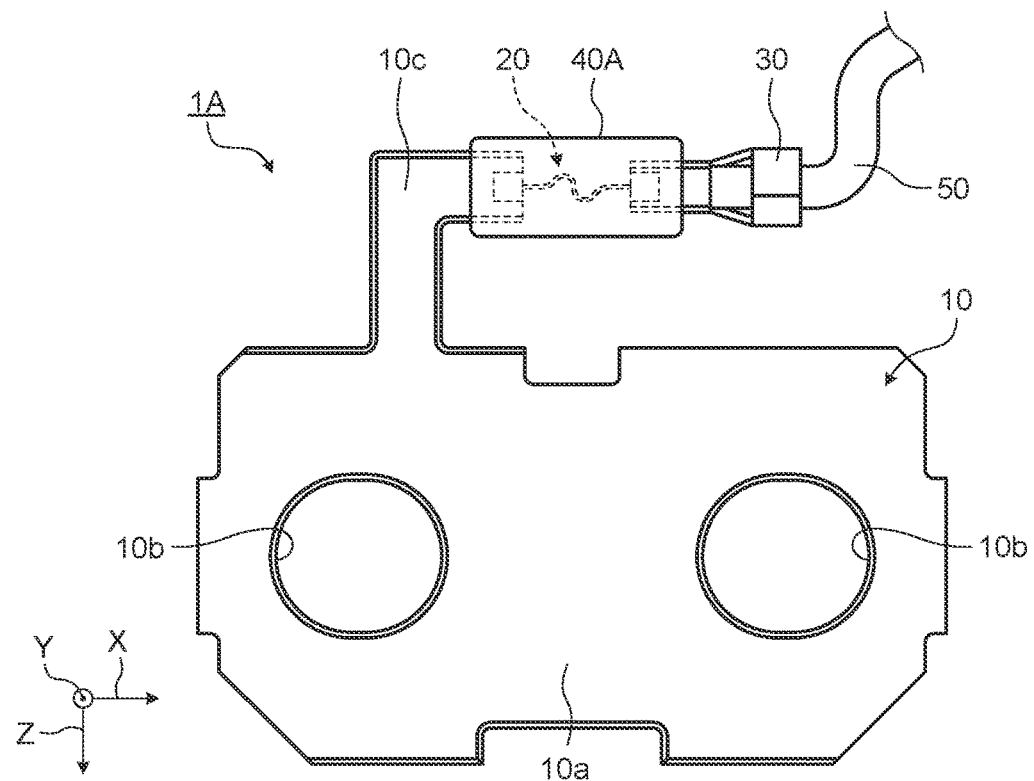
FIG. 3 is a plan view illustrating a schematic configuration of the connection structure of the conductor according to the first embodiment.
Figure 4:
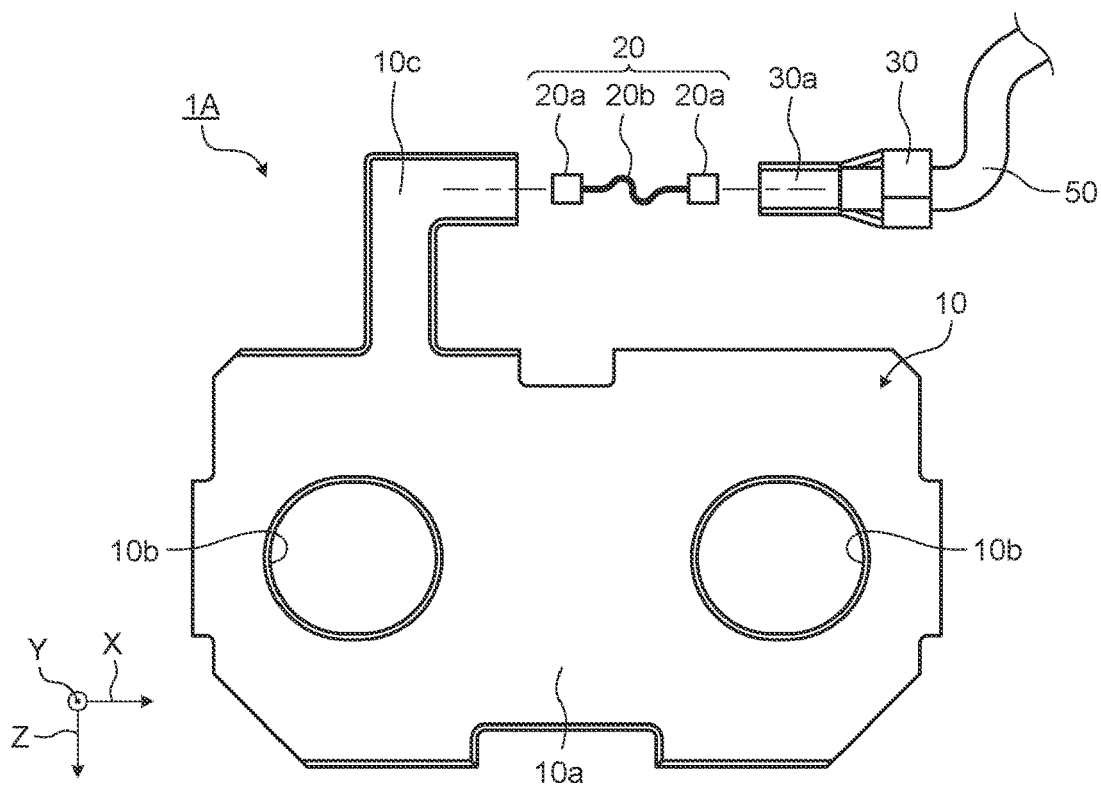
FIG. 4 is an exploded plan view illustrating a schematic configuration of the connection structure of the conductor according to the first embodiment.
Figure 5:
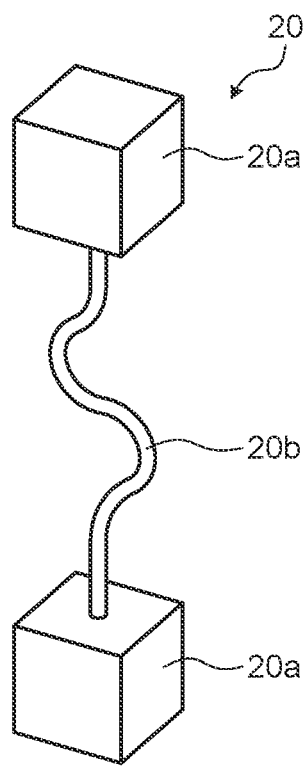
FIG. 5 is a perspective view illustrating a schematic configuration of a fuse element in the first embodiment.

A connection structure of a conductor and a conductive module according to a first embodiment will now be described. FIG. 1 is an exploded perspective view illustrating a schematic configuration of a conductive module to which a connection structure of a conductor according to the first embodiment is applied. FIG. 2 is a plan view illustrating a schematic configuration of the conductive module to which the connection structure of the conductor according to the first embodiment is applied. FIG. 3 is a plan view illustrating a schematic configuration of the connection structure of the conductor according to the first embodiment. FIG. 4 is an exploded plan view illustrating a schematic configuration of the connection structure of the conductor according to the first embodiment. FIG. 5 is a perspective view illustrating a schematic configuration of a fuse element in the first embodiment.

In the following explanation, the X direction in the drawing is a width direction of a conductive module in the present embodiment, and is an arranging direction of electrode terminals and a plurality of connection conductors. The Y direction is a vertical direction of the conductive module in the present embodiment, and is a direction orthogonal to the X direction. The Z direction is a depth direction of the conductive module in the present embodiment, and is a direction orthogonal to the X direction and the Y direction. It is to be noted that the Y direction is not limited to the vertical direction.

A conductive module 100 illustrated in FIG. 1 and FIG. 2 is to be assembled to a battery module (not illustrated) formed of a plurality of battery cells (not illustrated). For example, the battery module is mounted on an electric vehicle (EV) and a hybrid vehicle (HV and PHV), and used to supply electric power to a rotating electric machine that is a driving source, and store (charge) the electric power generated by the rotating electric machine. In the battery module, battery cells are arranged in the same direction such that one of the electrode terminals of the battery cells are arranged in a line, and the other electrode terminals of the battery cells are also arranged in line. The battery module functions as a desired power source, when the conductive module 100 is assembled corresponding to an electrode terminal group that is formed of a plurality of electrode terminals arranged in the same direction, and when the electrode terminals (positive electrode terminals and negative electrode terminals) of the battery cells are connected in series or in parallel by the conductive module 100. The conductive module 100 electrically connects the battery cells with a battery monitoring unit 200, which will be described below. More specifically, the conductive module 100 includes a plurality of conductors 1A and a housing case 60.

Each of the conductors 1A includes a connection conductor 10, a fuse element 20, a relay terminal 30, a resin mold member 40A, and a linear conductor 50. In the conductor 1A, the fuse element 20 and the relay terminal 30 are connected between the connection conductor 10 and the linear conductor 50. The conductor 1A has a connection structure in which the fuse element 20 and the relay terminal 30 are interposed between the connection conductor 10 and the linear conductor 50, all of which are electrically connected with one another.

The connection conductor 10 is a bus bar, for example, and is directly connected to at least one of the electrode terminals of the electrode terminal group of the battery cells arranged in the same direction. The connection conductor 10 is provided in plurality and the connection conductors 10 are arranged in the arranging direction of the electrode terminals. Each of the connection conductors 10 is made of a conductive material such as a plate metal, and is directly attached to an electrode terminal by inserting and screwing an electrode terminal into one or both of two through holes 10b. The connection conductor 10 may also be directly attached to two electrode terminals adjacent to each other in the arranging direction of the battery cells. In the conductive module 100, the connection conductors 10 are housed respectively in a plurality of housing space units 60a that are included in the housing case 60 and that are arranged in the arranging direction of the electrode terminals. As illustrated in FIG. 3 and FIG. 4, each of the connection conductors 10 includes a connection conductor body 10a, the through holes 10b, and a connecting unit 10c.

The connection conductor body 10a includes the through holes 10b penetrating in the Y direction. An electrode terminal that projects upward from each of the battery cells is inserted into each of the through holes 10b. The through holes 10b are formed by a punching process so as to leave a portion connected with the battery cell. The connecting unit 10c extends from the end of the connection conductor body 10a in the Z direction, and has an L-shape or a reverse L-shape, when the connecting unit 10c is viewed in a plan view from the Y direction. The connecting unit 10c is connected to the fuse element 20.

One of the ends of the fuse element 20 is directly connected to the connection conductor 10, and the other end of the fuse element 20 is connected to the linear conductor 50 with the relay terminal 30 interposed therebetween. In other words, the fuse element 20 is indirectly connected between the connection conductor 10 and the linear conductor 50. For example, the fuse element 20 is a fuse, and melts when overcurrent flows therethrough and cuts off the corresponding current path. In other words, the fuse element 20 melts when overcurrent flows between the connection conductor 10 and the linear conductor 50, and protects the battery monitoring unit 200 connected to the linear conductor 50 by this melting. For example, the overcurrent that flows through the fuse element 20 is current equal to or larger than a predetermined rated current. In other words, the fuse element 20 melts when current equal to or larger than a predetermined rated current flows therethrough. The rated current of the fuse element 20 is determined on the basis of the current of each circuit to be protected. As illustrated in FIG. 5, the fuse element 20 includes a pair of terminals 20a and a fusible part 20b provided between the pair of terminals 20a. One of the pair of terminals 20a is connected to the connecting unit 10c of the connection conductor 10, and the other terminal 20a is connected to the relay terminal 30. The one terminal 20a is connected to the connecting unit 10c by soldering, welding, or the like. The other terminal 20a is connected to the relay terminal 30 by soldering, welding, caulking, or the like. The fusible part 20b is made of metal such as tin or lead, and has a narrow wave shape. As described above, the fusible part 20b melts when current equal to or larger than a predetermined rated current flows therethrough.

One of the ends 30a of the relay terminal 30 is connected to the connection conductor 10 with the fuse element 20 interposed therebetween, and the other end of the relay terminal 30 is connected to the linear conductor 50. In other words, the relay terminal 30 is indirectly connected to the fuse element 20, between the connection conductor 10 and the linear conductor 50. The relay terminal 30 is a connection terminal made of a conductive material such as metal, and physically and electrically connects the fuse element 20 with the linear conductor 50. The relay terminal 30 connects the linear conductor 50 with the fuse element 20 in the extending direction of the linear conductor 50 and the fuse element 20 with the linear conductor 50 and the fuse element 20 facing each other. One of the ends 30a of the relay terminal 30 is connected to the terminal 20a of the fuse element 20, and the other end of the relay terminal 30 is connected to the end of the linear conductor 50 that is exposed by removing the insulating coating therefrom. The one end 30a of the relay terminal 30 is connected to the terminal 20a of the fuse element 20 by soldering, welding, or the like. The other end of the relay terminal 30 is connected to the end of the linear conductor 50 by crimping, soldering, welding, or the like.

For example, the resin mold member 40A is made of synthetic resin having an insulation property. As illustrated in FIG. 3, the resin mold member 40A includes the fuse element 20, a part of the connection conductor 10, and a part of the relay terminal 30. In other words, the resin mold member 40A is formed so as to cover the entire surface of the fuse element 20, a part of the surface of the connecting unit 10c of the connection conductor 10, and a part of the surface of the end 30a of the relay terminal 30. The resin mold member 40A is integrally molded with the connection conductor 10, the fuse element 20, the relay terminal 30, and the linear conductor 50. For example, a molding method of the resin mold member 40A includes an insert molding using a mold. In this case, an object to be molded that is obtained by connecting the connection conductor 10 with the relay terminal 30 with the fuse element 20 interposed therebetween, is first formed by welding or the like. The object to be molded is then set inside a molding mold. Next, melted resin is poured into the closed molding mold. Wait until the resin is cooled, open the molding mold, and extract the object to be molded therefrom. Then, cut off unnecessary resin from the resin mold member 40A formed into the object to be molded.

As illustrated in FIG. 2, the linear conductor 50 is connected to the battery monitoring unit 200. More specifically, one of the ends of the linear conductor 50 that is exposed by removing the insulating coating therefrom is connected to the other end of the relay terminal 30, and the other end of the linear conductor 50 is connected to the battery monitoring unit 200. The battery monitoring unit 200 monitors the battery state of the battery cells. For example, the battery monitoring unit 200 is a voltage detection device, and detects the terminal voltages of the battery cells. In this case, the linear conductor 50 configures a voltage detection line. For example, the battery monitoring unit 200 is configured of an operational amplifier, an analog-to-digital converter, and the like. The battery monitoring unit 200 samples the terminal voltage of the battery cell in a predetermined cycle, and converts the terminal voltage to a digital signal for output. The battery monitoring unit 200 is connected to an engine control unit (ECU), which is not illustrated, mounted on a vehicle, and outputs a value of the terminal voltage of the battery cell to the ECU.

For example, the housing case 60 is made of synthetic resin having an insulation property and the like, and houses the conductors 1A. The housing case 60 includes the hollow housing space units 60a that respectively house the connection conductors 10, and a hollow wiring space unit 60b in which a plurality of the linear conductors 50 can be disposed. Each of the housing space units 60a houses the connection conductor 10 that is integrally formed with the resin mold member 40A including the fuse element 20 and a part of the connection conductor 10, from an opening provided in the Y direction. The wiring space unit 60b houses the linear conductor 50 extending from the connection conductor 10 housed in the housing space unit 60a, from an opening provided in the Y direction.

The connection structure of the conductor 1A of the first embodiment described above includes the connection conductor 10 that is directly connected to at least one of the electrode terminals of the electrode terminal group of the battery cells arranged in the same direction; the linear conductor 50 that is connected to the battery monitoring unit 200 configured to monitor the battery state of the battery cells; the fuse element 20 that is indirectly connected between the connection conductor 10 and the linear conductor 50, and that melts when overcurrent flows between the connection conductor 10 and the linear conductor 50; and the resin mold member 40A that has an insulation property and that includes the fuse element 20, a part of the connection conductor 10, and a part of the relay terminal 30.

Moreover, the conductive module 100 of the first embodiment described above includes the connection conductor 10 that is directly connected to at least one of the electrode terminals of the electrode terminal group of the battery cells arranged in the same direction; the linear conductor 50 connected to the battery monitoring unit 200 configured to monitor the battery state of the battery cells; the fuse element 20 that is indirectly connected between the connection conductor 10 and the linear conductor 50, and that melts when overcurrent flows between the connection conductor 10 and the linear conductor 50; and the resin mold member 40A that includes the fuse element 20, a part of the connection conductor 10, and a part of the relay terminal 30. The conductive module 100 of the first embodiment described above also includes the connection conductors 10 corresponding to at least one of the electrode terminals. The connection conductors 10 are housed respectively in the housing space units 60a that are included in the housing case 60 having an insulation property and that are arranged in the arranging direction of the electrode terminals.

In the connection structure of the conductor 1A and the conductive module 100 having the above configuration, the connection conductor 10 is directly connected to the fuse element 20 without the relay terminal interposed therebetween. Thus, it is possible to reduce relay terminals in number that are used for connecting the connection conductors 10 with the linear conductors 50. It is also possible to reduce the size and weight of the conductor 1A and the conductive module 100, as well as reduce the component cost. Moreover, reducing the number of relay terminals and the number of electrical connection points decrease the resistance value of the battery monitoring unit 200. Consequently, it is possible to accurately detect the terminal voltage of the battery cell. Furthermore, the fuse element 20 is connected between the connection conductor 10 and the linear conductor 50. Consequently, it is also possible to protect the conductor 1A and the battery monitoring unit 200 from overcurrent. Still furthermore, in the connection structure of the conductor 1A and the conductive module 100, the resin mold member 40A includes the fuse element 20, a part of the connection conductor 10, and a part of the relay terminal 30, thereby allowing the connection conductor 10, the fuse element 20, and the relay terminal 30 to be handled as a single component. This eliminates an assembly process of a fuse and a relay terminal to the housing case 60 when the conductors 1A are to be assembled to the conductive module 100 and the like, thereby improving the workability during assembly.

Second Embodiment

Figure 6:
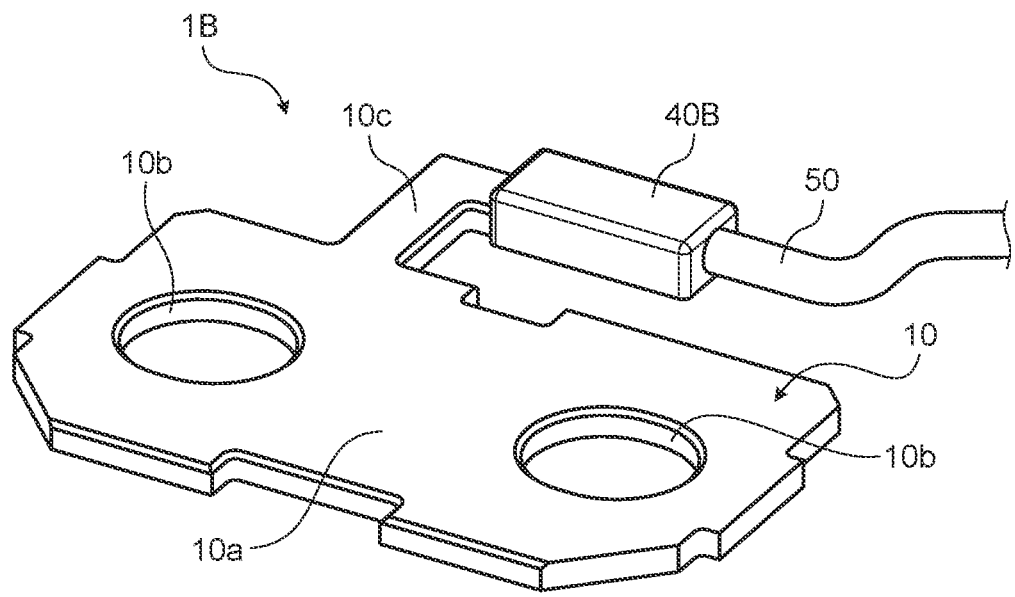
FIG. 6 is a perspective view illustrating a schematic configuration of a connection structure of a conductor according to a second embodiment.
Figure 7:
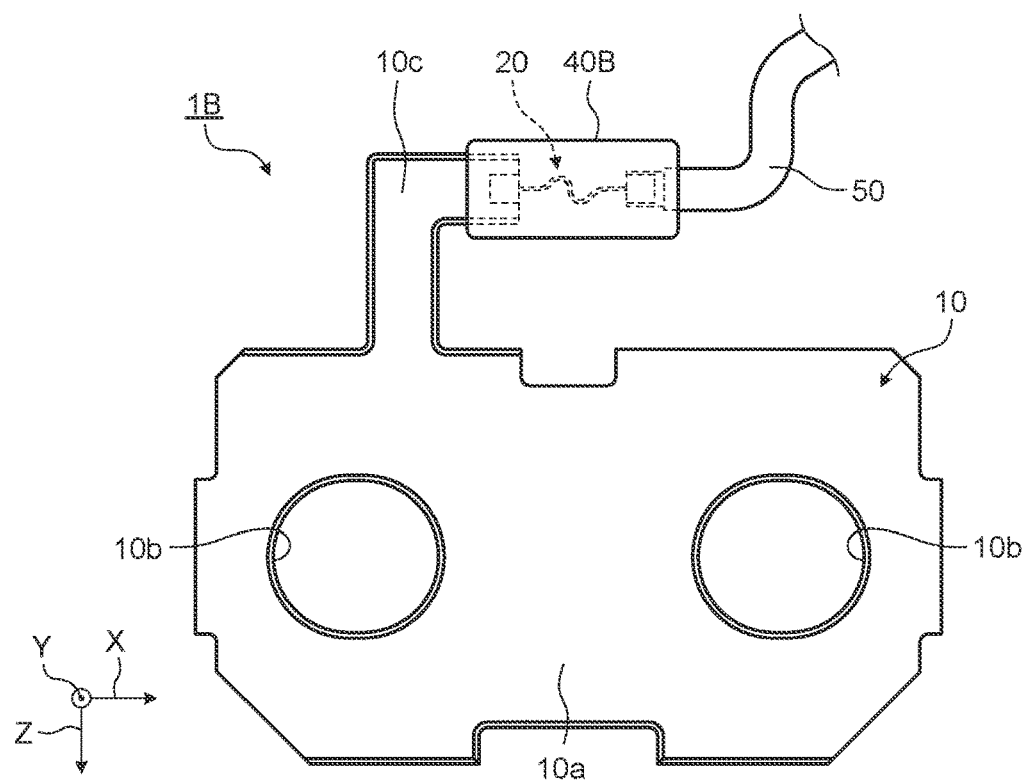
FIG. 7 is a plan view illustrating a schematic configuration of the connection structure of the conductor according to the second embodiment.
Figure 8:
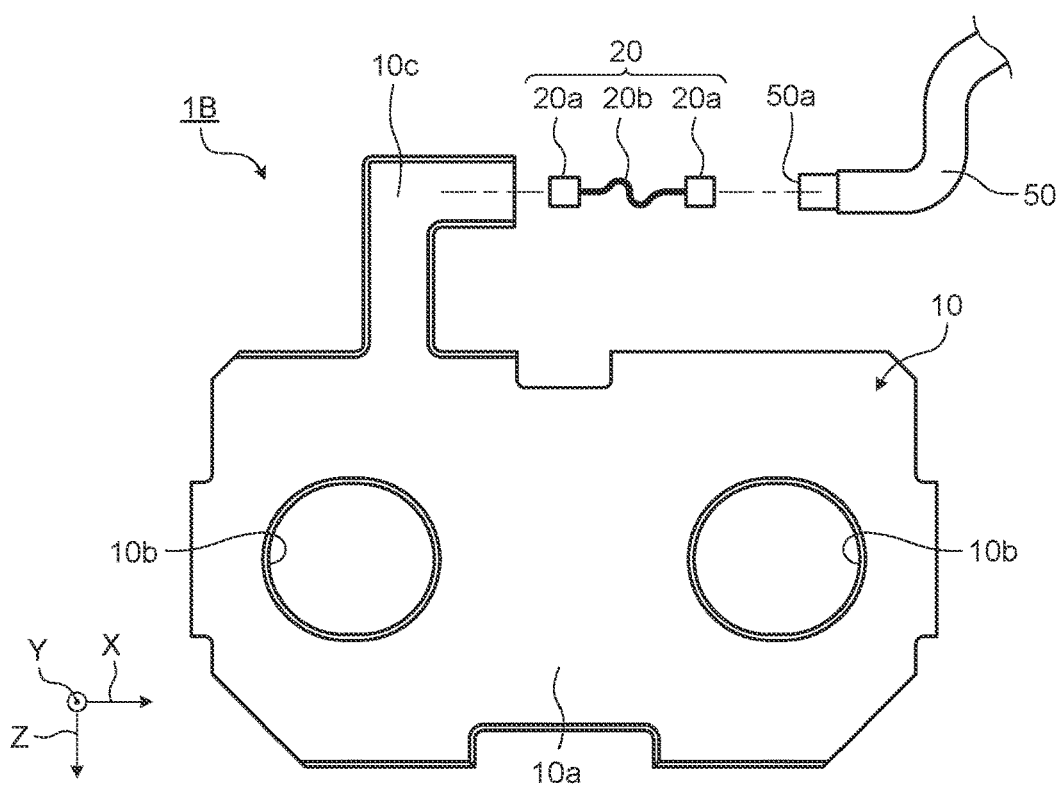
FIG. 8 is an exploded plan view illustrating a schematic configuration of the connection structure of the conductor according to the second embodiment.

Next, a connection structure of a conductor and a conductive module according to a second embodiment will be described. FIG. 6 is a perspective view illustrating a schematic configuration of a connection structure of a conductor according to the second embodiment. FIG. 7 is a plan view illustrating a schematic configuration of the connection structure of the conductor according to the second embodiment. FIG. 8 is an exploded plan view illustrating a schematic configuration of the connection structure of the conductor according to the second embodiment.

As illustrated in FIG. 6 to FIG. 8, the connection structure of a conductor 1B and the conductive module 100 according to the second embodiment are different from the connection structure of the conductor 1A and the conductive module 100 according to the first embodiment described above in that the fuse element 20 alone is connected between the connection conductor 10 and the linear conductor 50. In the following explanation, the same reference numerals denote the same components as in the first embodiment described above, and the description thereof will be omitted.

The conductor 1B includes the connection conductor 10, the fuse element 20, a resin mold member 40B, and the linear conductor 50. In the conductor 1B, the fuse element 20 is connected between the connection conductor 10 and the linear conductor 50. The conductor 1B has a connection structure in which the connection conductor 10, the fuse element 20, the resin mold member 40B, and the linear conductor 50 are electrically connected with one another.

One of the ends of the fuse element 20 in the second embodiment is directly connected to the connection conductor 10, and the other end of the fuse element 20 is directly connected to the linear conductor 50. In other words, the fuse element 20 is directly connected between the connection conductor 10 and the linear conductor 50. More specifically, one of the terminals 20a of the fuse element 20 is connected to the connecting unit 10c of the connection conductor 10, and the other terminal 20a of the fuse element 20 is connected to the linear conductor 50. The one terminal 20a is connected to the connecting unit 10c by soldering, welding, or the like. The other terminal 20a is connected to the linear conductor 50 by soldering, welding, caulking, or the like.

As illustrated in FIG. 7, the resin mold member 40B includes the fuse element 20, a part of the connection conductor 10, and an end 50a of the linear conductor 50. In other words, the resin mold member 40B is formed so as to cover the entire surface of the fuse element 20, a part of the surface of the connecting unit 10c of the connection conductor 10, and the surface of the end 50a of the linear conductor 50. The resin mold member 40B is integrally molded with the connection conductor 10, the fuse element 20, and the linear conductor 50. It is to be noted that the molding method of the resin mold member 40B is the same as that in the first embodiment described above.

One of the ends 50a of the linear conductor 50 in the second embodiment that is exposed by removing the insulating coating therefrom is connected to the other terminal 20a of the fuse element 20, and the other end of the linear conductor 50 is connected to the battery monitoring unit 200.

The connection structure of the conductor 1B of the second embodiment described above includes the connection conductor 10 that is directly connected to at least one of the electrode terminals of the electrode terminal group of the battery cells arranged in the same direction; the linear conductor 50 that is connected to the battery monitoring unit 200 configured to monitor the battery state of the battery cells; the fuse element 20 that is directly connected between the connection conductor 10 and the linear conductor 50, and that melts when overcurrent flows between the connection conductor 10 and the linear conductor 50; and the resin mold member 40B that has an insulation property and that includes the fuse element 20, a part of the connection conductor 10, and the end 50a of the linear conductor 50.

Moreover, the conductive module 100 of the second embodiment described above includes the connection conductor 10 that is directly connected to at least one of the electrode terminals of the electrode terminal group of the battery cells arranged in the same direction; the linear conductor 50 that is connected to the battery monitoring unit 200 configured to monitor the battery state of the battery cells; the fuse element 20 that is directly connected between the connection conductor 10 and the linear conductor 50, and that melts when overcurrent flows between the connection conductor 10 and the linear conductor 50; and the resin mold member 40B that includes the fuse element 20, a part of the connection conductor 10, and the end 50a of the linear conductor 50. The conductive module 100 of the second embodiment described above also includes the connection conductors 10 corresponding to at least one of the electrode terminals. The connection conductors 10 are respectively housed in the housing space units 60a that are included in the housing case 60 having an insulation property and that are arranged in the arranging direction of the electrode terminals.

In the connection structure of the conductor 1B and the conductive module 100 configured as the above, the connection conductor 10 is directly connected to the fuse element 20 without the relay terminal 30 interposed therebetween, and the connection conductor 10 is directly connected to the linear conductor 50 with the fuse element 20 interposed therebetween. Consequently, the effects achieved by the connection structure of the conductor 1A and the conductive module 100 of the first embodiment described above can also be achieved.

In the first and second embodiments described above, the connection conductor 10 is the bus bar. However, it is not limited thereto. In other words, the connection conductor 10 may be a conductor indirectly connected to at least one of the electrode terminals of the electrode terminal group of the battery cells arranged in the same direction, via a bus bar. In this case, the connection conductor 10 is physically and electrically connected to the bus bar. For example, the connection conductor 10 is connected to the bus bar by using a fitting structure, welding, screwing, or the like.

In the first and second embodiments described above, the connection conductor 10 extends from the end of the connection conductor body 10a in the Z direction, and the fuse element 20 is connected to the connecting unit 10c having an L-shape or a reverse L-shape when the connecting unit 10c is viewed in a plan view from the Y direction. However, it is not limited thereto, and the fuse element 20 may be directly connected to the connection conductor body 10a. In this case, the resin mold members 40A and 40B are formed so as to cover the entire surface of the fuse element 20, a part of the surface of the connection conductor 10, and a part of the surface of the end 30a of the relay terminal 30 or a part of the surface of the end 50a of the linear conductor 50.

In the first and second embodiments described above, the circuit configuration of the battery monitoring unit 200 is not specifically limited. For example, the battery monitoring unit 200 may be configured so as to detect the terminal voltage of each single battery or the terminal voltage of the entire battery pack.

In the first and second embodiments described above, the shape and configuration of the fuse element 20 are not limited to the examples illustrated, as long as the fuse element 20 melts when current equal to or larger than a predetermined rated current flows therethrough.

The connection structure of the conductor and the conductive module according to the present embodiments are capable of achieving downsizing.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A connection structure of a conductor, comprising:
   a flat plate shaped bus bar that is directly or indirectly connected to at least one of a plurality of electrode terminals of an electrode terminal group of a plurality of battery cells arranged in a same direction, and the bus bar including a body having a pair of through holes, and a connection portion integrally formed with the body;
   a linear conductor that is connected to a battery monitoring unit configured to monitor a battery state of the battery cells;
   a fuse element that is directly connected to the connection portion and directly or indirectly connected to the linear conductor, and that melts when overcurrent flows between the connection portion and the linear conductor; and
   a resin mold member that has an insulation property and that is integrally formed so that an entire surface of the fuse element and a part of the connection portion are wrapped in the resin mold member, wherein
   the resin mold member is spaced away from the body of the bus bar, and overlaps with the body when viewed from a direction orthogonal to both an arranging direction of the pair of through holes and a penetration direction of the through holes,
   the connection portion includes a first connection portion and a second connection portion, the first connection portion extends away from the body in a direction that intersects the arranging direction, the second connection portion extends away from the first connection portion in the arranging direction, and both of the first connection portion and the second connection portion are coplanar with the body, and
   the fuse element is directly connected to the second connection portion.

2. The connection structure of the conductor according to claim 1, wherein
   the fuse element is connected to the linear conductor via a relay terminal made of metal, and
   the resin mold member further wraps a part of a surface of the relay terminal.

3. The connection structure of the conductor according to claim 2, wherein
   the fuse element includes a pair of terminals and a fusible part provided between the pair of terminals, and
   the second connection portion is directly connected to one of the pair of terminals, and the linear conductor or the relay terminal is connected to the other terminal.

4. A conductive module, comprising:
   a plurality of conductors that correspond to at least one of electric terminals, each of the conductors including
   a flat plate shaped bus bar that is directly or indirectly connected to at least one of the electrode terminals of an electrode terminal group of a plurality of battery cells arranged in a same direction, and the bus bar including a body having a pair of through holes, and a connection portion integrally formed with the body,
   a linear conductor that is connected to a battery monitoring unit configured to monitor a battery state of the battery cells,
   a fuse element that is directly connected to the connection portion and directly or indirectly connected to the linear conductor, and that melts when overcurrent flows between the connection portion and the linear conductor, and
   a resin mold member that has an insulation property and that is integrally formed so that an entire surface of the fuse element and a part of the connection portion are wrapped in the resin mold member, wherein
   the bus bars are respectively housed in a plurality of housing space units that are included in a housing case having an insulation property and that are arranged in an arranging direction of the electrode terminals,
   the resin mold member is spaced away from each of the housing space units, and overlaps with the body when viewed from a direction orthogonal to both an arranging direction of the pair of through holes and a penetration direction of the through holes,
   the connection portion includes a first connection portion and a second connection portion, the first connection portion extends away from the body in a direction that intersects the arranging direction, the second connection portion extends away from the first connection portion in the arranging direction, and both of the first connection portion and the second connection portion are coplanar with the body, and
   the fuse element is directly connected to the second connection portion.

5. The connection structure of the conductor according to claim 3, wherein
   the fusible part has a wave shape.

6. The connection structure of the conductor according to claim 3, wherein
   a connection part between the second connection portion and the fuse element, and a connection part between the fuse element and the linear conductor are arranged in an arranging direction of the battery cells.

7. The connection structure of the conductor according to claim 1, wherein
the fuse element is suspended to span a gap between the connection portion and the linear conductor.

\* \* \* \* \*